(12) United States Patent
Hasegawa et al.

(10) Patent No.: US 10,176,747 B2
(45) Date of Patent: Jan. 8, 2019

(54) DISPLAY DRIVER HAVING OUTPUT ELECTRICAL CURRENT CAPACITY SETTING PORTION

(71) Applicant: LAPIS SEMICONDUCTOR CO., LTD., Kanagawa (JP)

(72) Inventors: Hideaki Hasegawa, Kanagawa (JP); Hideki Masai, Kanagawa (JP)

(73) Assignee: LAPIS SEMICONDUCTOR CO., LTD., Kanagawa (JP)

( * ) Notice: Subject to any disclaimer, the term of this patent is extended or adjusted under 35 U.S.C. 154(b) by 0 days.

(21) Appl. No.: 15/465,691

(22) Filed: Mar. 22, 2017

(65) Prior Publication Data

US 2017/0287383 A1 Oct. 5, 2017

(30) Foreign Application Priority Data

Mar. 30, 2016 (JP) .................................. 2016-067098

(51) Int. Cl.
*G09G 3/36* (2006.01)
*G09G 3/20* (2006.01)
*G11C 19/18* (2006.01)
*G11C 19/28* (2006.01)

(52) U.S. Cl.
CPC ......... *G09G 3/2092* (2013.01); *G11C 19/184* (2013.01); *G11C 19/28* (2013.01); *G09G 2310/0291* (2013.01); *G09G 2310/08* (2013.01); *G09G 2320/0233* (2013.01)

(58) Field of Classification Search
CPC ..... G09G 2310/027; G09G 2310/0272; G09G 2310/0275
USPC ......................................................... 345/100
See application file for complete search history.

(56) References Cited

U.S. PATENT DOCUMENTS

2001/0040519 A1\* 11/2001 Sagawa ................ G09G 3/3685
341/141
2002/0097208 A1\* 7/2002 Hashimoto .......... G09G 3/3607
345/87
2004/0189579 A1 9/2004 Shimizu

FOREIGN PATENT DOCUMENTS

JP 2004-301946 A 10/2004

\* cited by examiner

*Primary Examiner* — Roy P Rabindranath
(74) *Attorney, Agent, or Firm* — Kubotera & Associates, LLC

(57) ABSTRACT

A display driver is configured to drive a display device according to a video signal. The display signal includes a plurality of first to N-th output amplifiers (N is an integer greater than two) and an output electrical current capacity setting portion. The first to N-th output amplifiers are configured to amplify first to N-th gradation voltages a representing brightness level per pixel according to the video signal, so that the first to N-th output amplifiers obtain first to N-th pixel drive voltages. Further, the first to N-th output amplifiers are configured to output the first to N-th pixel drive voltages to the display device. The output electrical current capacity setting portion is configured to set an output electrical current capacity of each of the first to N-th output amplifiers individually or in a group of a plurality of output amplifiers.

7 Claims, 9 Drawing Sheets

DISPLAY DRIVER HAVING OUTPUT ELECTRICAL CURRENT CAPACITY SETTING PORTION

BACKGROUND OF THE INVENTION AND RELATED ART STATEMENT

The present invention relates to a display driver for driving a display device according to a video signal.

In a conventional display panel such as a liquid crystal display panel, a plurality of gate signal lines is arranged to extend in a horizontal direction of a two-dimensional screen. Further, a plurality of source signal lines is arranged to extend in a vertical direction of the two-dimensional screen, so that the source signal lines cross the gate signal lines.

Further, the conventional display panel includes a conventional source driver for applying a gradation voltage corresponding to a brightness level of each pixel indicated with an input video signal to each of the source signal lines. Further, the conventional display panel includes a conventional gate driver for applying a scanning signal to each of the gate signal lines (refer to Patent Reference).

Patent Reference: Japanese Patent Publication No. 2004-301946

In the conventional display panel, when a screen size is increased, the gate signal lines extending in the horizontal direction of the two-dimensional screen tend to have an increased wiring resistivity. As a result, it tends to take a longer period of time for the scanning signal output from the gate driver to reach a pixel situated far from the gate driver, as compared to a pixel situated near the gate driver. Accordingly, each of the pixels tend to have different the brightness levels according to a location of each pixel on the gate signal lines, thereby causing so-called display variance.

In view of the problems described above, an object of the present invention is to provide a display driver capable of solving the problems of the conventional display driver. In the present invention, it is possible to display an image on a display device while minimizing the display variance.

Further objects and advantages of the invention will be apparent from the following description of the invention.

SUMMARY OF THE INVENTION

In order to attain the objects described above, according to a first aspect of the present invention, a display driver is configured to drive a display device according to a video signal. The display signal includes a plurality of first to N-th output amplifiers (N is an integer greater than two) and an output electrical current capacity setting portion.

According to the first aspect of the present invention, the first to N-th output amplifiers are configured to amplify first to N-th gradation voltages a representing brightness level per pixel according to the video signal, so that the first to N-th output amplifiers obtain first to N-th pixel drive voltages. Further, the first to N-th output amplifiers are configured to output the first to N-th pixel drive voltages to the display device. The output electrical current capacity setting portion is configured to set an output electrical current capacity of each of the first to N-th output amplifiers individually or in a group of a plurality of output amplifiers.

According to the first aspect of the present invention, the first to N-th output amplifiers are configured to output the first to N-th pixel drive voltages to the display device. Further, the output electrical current capacity setting portion is configured to set the output electrical current capacity of each of the first to N-th output amplifiers individually or in a group of a plurality of output amplifiers. Accordingly, it is possible to obtain a constant delay time of each of the first to N-th pixel drive voltages, in which each of the first to N-th pixel drive voltages takes to reach to the display device through first to N-th pixel external wirings corresponding to each of the first to N-th pixel drive voltages.

According to the present invention, it is possible to display a video on the display device while minimizing the display variance.

DETAILED DESCRIPTION OF PREFERRED EMBODIMENTS

Hereunder, preferred embodiments of the present invention will be explained with reference to the accompanying drawings.

First Embodiment

Figure 1:
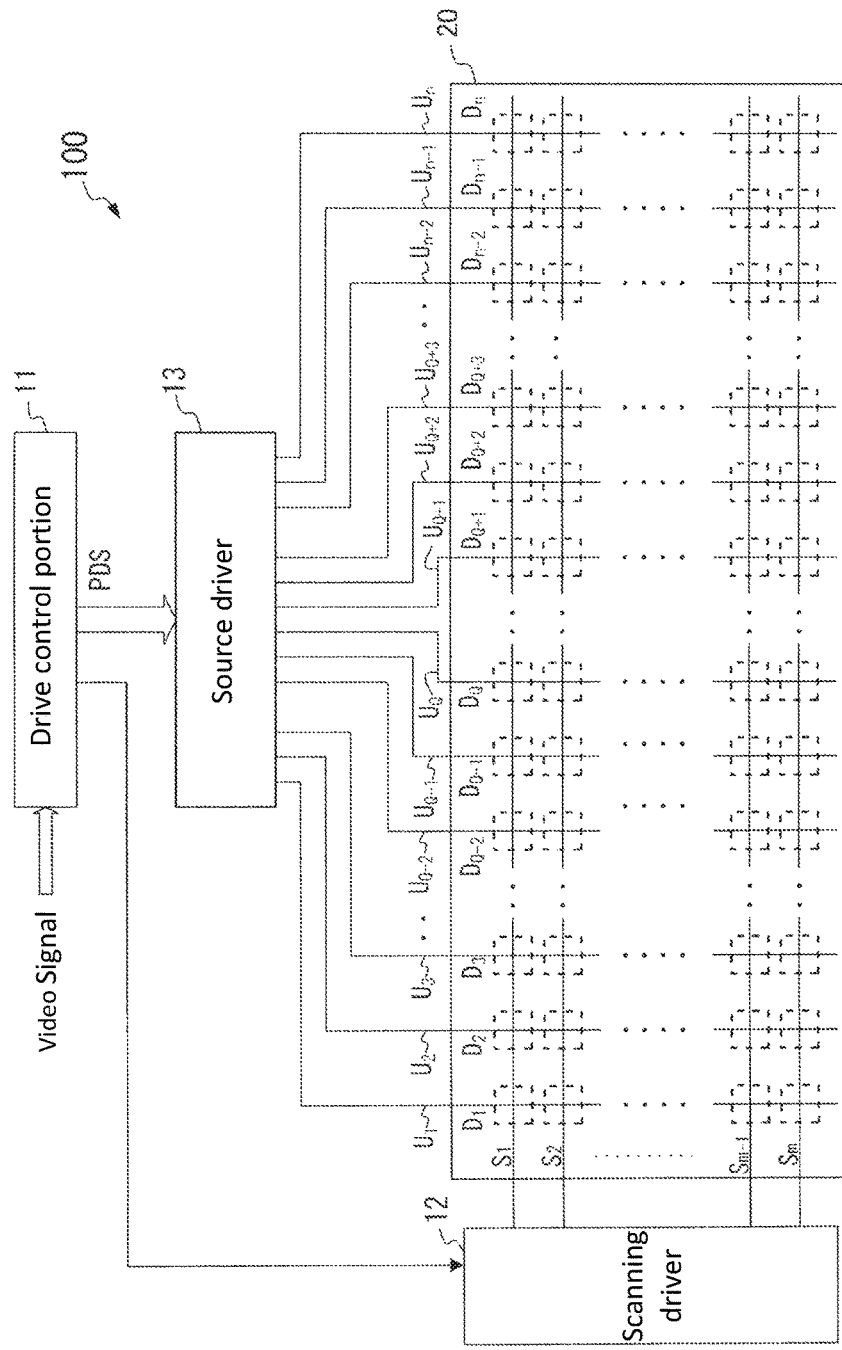
FIG. 1 is a block diagram showing a schematic configuration of a display device having a source driver as a display driver according to a first embodiment of the present invention.

A first embodiment of the present invention will be explained. FIG. 1 is a block diagram showing a schematic configuration of a display device 100 having a source driver 13 as a display driver according to the first embodiment of the present invention. As shown in FIG. 1, the display device 100 includes a drive control portion 11; a scanning driver 12; the source driver 13; and a display portion 20.

In the first embodiment, the display portion 20 is formed of, for example, a liquid crystal panel, an organic EL panel, and the like. Further, the display portion 20 includes horizontal scanning lines S1 to Sm in the number of m (m is a natural number greater than two) and source lines D1 to Dn in the number of n (n is a natural number greater than two). The horizontal scanning lines S1 to Sm are arranged to extend in a horizontal direction of a two dimensional screen, and the source lines D1 to Dn are arranged to extend in a vertical direction of the two dimensional screen. Further, the horizontal scanning lines S1 to Sm and the source lines D1 to Dn are arranged such that a display cell as a pixel is formed in a region of each of crossing portion of the horizontal scanning lines S1 to Sm and the source lines D1 to Dn.

In the first embodiment, the drive control portion 11 is configured to extract a horizontal synchronization signal from a video signal, and supplies the horizontal synchronization signal to the scanning driver 12. Further, the drive control portion 11 is configured to generate a series of pixel data DD representing a brightness level of a pixel with, for example, eight bits per pixel according to the horizontal synchronization signal, and to supply the pixel data DD to the source driver 13 as a pixel data signal PDS.

In the first embodiment, the scanning driver 12 is configured to generate a horizontal scanning signal synchronized with the horizontal synchronization signal, and to sequentially apply the horizontal scanning signal to each of the horizontal scanning lines S1 to Sm of the display portion 20.

In the first embodiment, the source driver 13 is formed of, for example, a semiconductor chip, and is configured to capture the series of the pixel data PD in the pixel data signal PDS. Every time when the source driver 13 captures the pixel data PD of one horizontal scanning line, that is, in the number of n, which is a total number of the source lines, the source driver 13 is configured to convert the pixel data PD in the number of n thus captured to a pixel drive voltage having a voltage value corresponding to the brightness level represented with each of the pixel data PD. Then, the source driver 13 is configured to apply the pixel drive voltage to the source lines D1 to Dn of the display portion 20.

Figure 2:
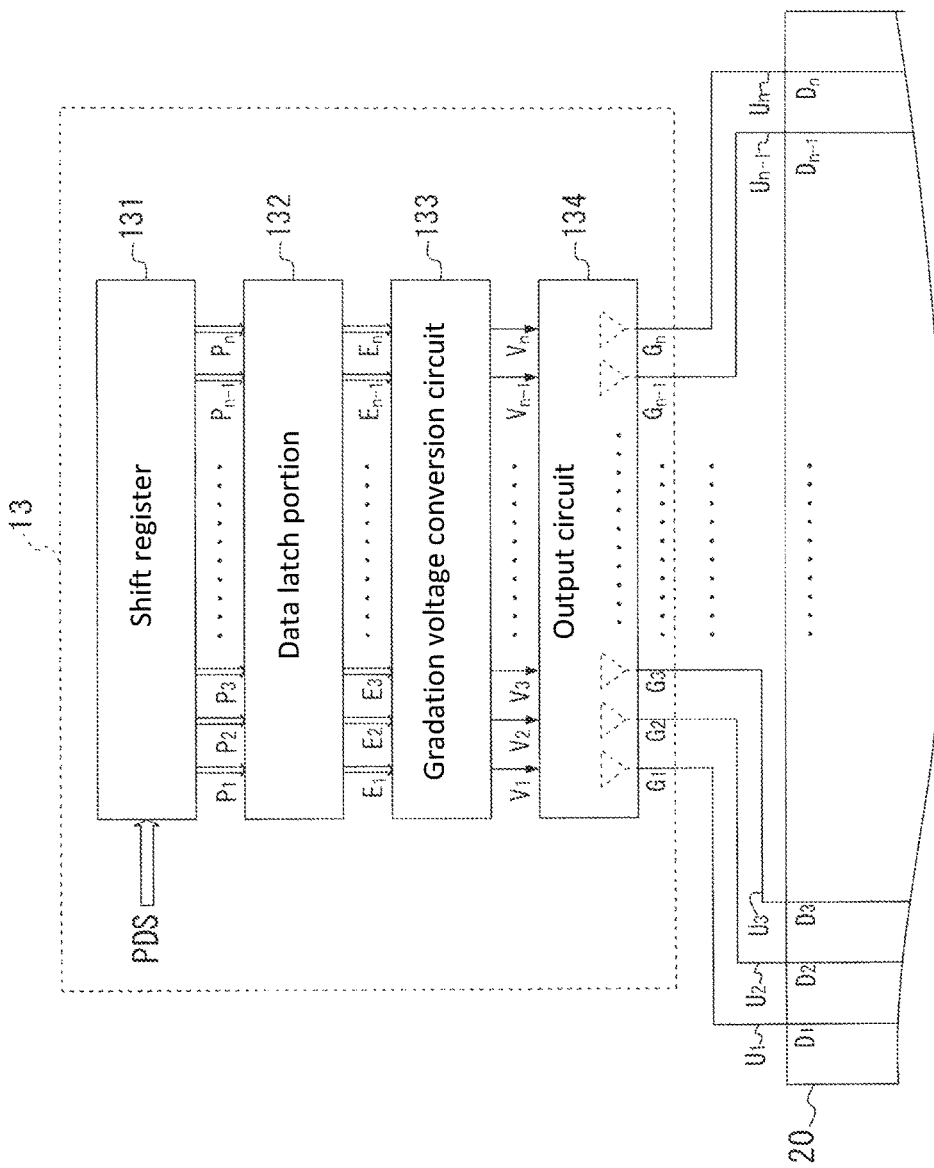
FIG. 2 is a block diagram showing an internal configuration of the source driver according to the first embodiment of the present invention.

FIG. 2 is a block diagram showing an internal configuration of the source driver 13 according to the first embodiment of the present invention. As shown in FIG. 2, the source driver 13 includes a shift register 131; a data latch portion 132; a gradation voltage conversion circuit 133; and an output circuit 134.

In the first embodiment, the shift register 131 is configured to retrieve the series of the pixel data PD from the pixel data signal PDS supplied from the drive control portion 11. Further, the shift register 131 is configured to supply the pixel data PD for one horizontal scanning line (in the number of n) to the data latch portion 132 as pixel data P1 to Pn.

In the first embodiment, the data latch portion 132 is configured to retrieve the pixel data P1 to Pn. Further, the data latch portion 132 is configured to supply the pixel data P1 to Pn to the gradation voltage conversion circuit 133 as pixel data E1 to En.

In the first embodiment, the gradation voltage conversion circuit 133 is configured to convert the pixel data E1 to En to gradation voltages V1 to Vn each having a voltage value corresponding to each of the brightness levels. Further, the gradation voltage conversion circuit 133 is configured to supply the gradation voltages V1 to Vn to the output circuit 134.

In the first embodiment, the output circuit 134 is configured to amplify the gradation voltages V1 to Vn, so that the output circuit 134 generates pixel drive voltages G1 to Gn. Further, the output circuit 134 is configured to apply the pixel drive voltages G1 to Gn to each of the source lines D1 to Dn of the display portion 20 through external wirings U1 to Un corresponding to each of the pixel drive voltages G1 to Gn.

As shown in FIG. 2, in the first embodiment, the source driver 13 has a chip size smaller than a lateral width of the display portion 20. Further, the source driver 13 is disposed along one side of the display portion 20 at a central position of the one side. In this case, the external wirings U1 to Un, which connect the output circuit 134 and the source lines D1 to Dn, have a shortest wiring length at the central position of the one side of the display portion 20. Further, the wiring length of the external wirings U1 to Un increases toward both end portions of the display portion 20.

More specifically, in the display device 100 shown in FIG. 1, if the number n is an even number, among the external wirings U1 to Un, external wirings UQ and UQ+1 (Q is equal to n/2) that are disposed at the central position of the one side of the display portion 20 have a shortest wiring length. Further, external wirings U1 and Un that are disposed at the both end portions of the one side of the display portion 20 have a longest wiring length. Accordingly, the external wirings UQ and UQ+1 disposed at the central position tend to have a smallest wiring resistivity, and the wiring resistivity increases toward the both end portions. As a result, among the external wirings U1 to Un, the external wirings U1 and Un tend to have a largest transmission delay, and the transmission delay decreases toward the external wirings UQ and UQ+1.

Further, if the number n is an odd number, among the external wirings U1 to Un, the external wiring UQ (Q is equal to (n+1)/2) that is disposed at the central position of the one side of the display portion 20 have a shortest wiring length, and the external wirings U1 and Un disposed at the both end portions of the one side of the display portion 20 have a longest wiring length. Accordingly, the external wirings U1 and Un tend to have a largest transmission delay, and the transmission delay decreases toward in the order of the external wirings U2, U3, . . . , UQ−1, (Un−1, Un−2, . . . , UQ+1) and UQ.

Figure 3:
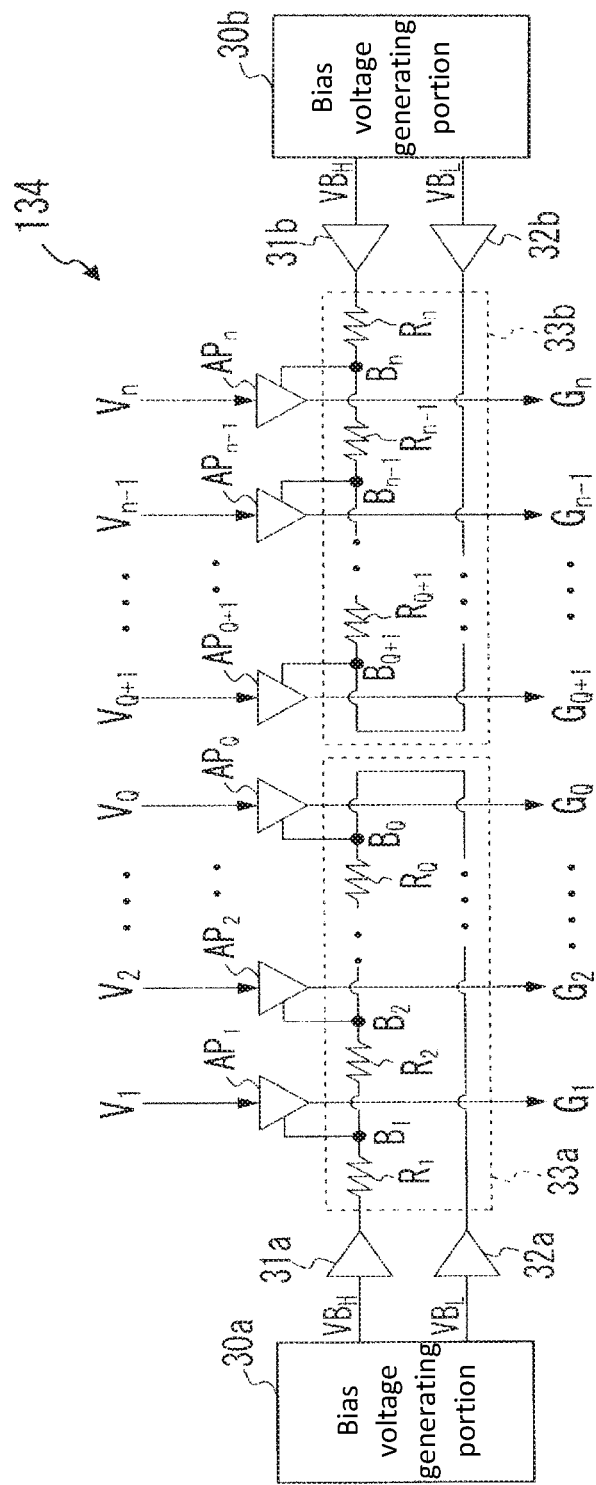
FIG. 3 is a circuit diagram showing an internal configuration of an output circuit of the source driver according to the first embodiment of the present invention.

FIG. 3 is a circuit diagram showing an internal configuration of the output circuit 134 of the source driver 13 according to the first embodiment of the present invention.

As shown in FIG. 3, the output circuit 134 includes bias voltage generating portions 30a and 30b; bias voltage amplifiers 31a, 31b, 32a, and 32b; bias voltage supplying paths 33a and 33b; and amplifiers AP1 to APn for n channels disposed corresponding to the gradation voltages V1 to Vn.

In the first embodiment, the bias voltage generating portion 30a is configured to generate a bias voltage VBH on a high potential side and a bias voltage VBL on a low potential side having a potential lower than the bias voltage VBH. The bias voltage amplifier 31a is configured to amplify the bias voltage VBH generated with the bias voltage generating portion 30a to obtain a potential, and to supply the potential thus obtained to one end portion of the bias voltage supplying path 33a. The bias voltage amplifier 32a is configured to amplify the bias voltage VBL generated with the bias voltage generating portion 30a to obtain a potential, and to supply the potential thus obtained to the other end portion of the bias voltage supplying path 33a.

As shown in FIG. 3, the bias voltage supplying path 33a includes a voltage dividing resistor portion formed of resistors R1 to RQ connected in series. In the bias voltage supplying path 33a, one end portion of the resistor R1 corresponds to the one end portion of the bias voltage supplying path 33a, and one end portion of the resistor RQ corresponds to the other end portion of the bias voltage supplying path 33a.

In the first embodiment, in the bias voltage supplying path 33a, the other end portion of the resistor R1 is connected to one end portion of the resistor R2, so that a voltage at a connecting point of the resistors R1 and R2 is supplied to the amplifier AP1 as a bias voltage B1. Further, in the bias voltage supplying path 33a, the other end portion of the resistor R2 is connected to one end portion of the resistor R3, so that a voltage at a connecting point of the resistors R2 and R3 is supplied to the amplifier AP2 as a bias voltage B2. Accordingly, in the bias voltage supplying path 33a, the other end portion of the resistor RK (K is an integer from one to Q) is connected to one end portion of the resistor RK+1, so that a voltage at a connecting point of the resistors RK and RK+1 is supplied to the amplifier APK as a bias voltage BK.

With the configuration described above, the bias voltage supplying path 33a divides the voltages with the resistors R1 to RQ based on the bias voltage VBH on the high potential side and the bias voltage VBL on the low potential side, so that the bias voltage supplying path 33a generates the bias voltages B1 to BQ. Further, the bias voltage supplying path 33a supplies the bias voltages B1 to BQ to the amplifiers AP1 to APQ corresponding to the bias voltages B1 to BQ.

In the first embodiment, the bias voltages B1 to BQ have the following relationship:

$$B1>B2>B3> \ldots >BQ-1>BQ$$

More specifically, the bias voltage supplying path 33a is configured to supply the voltages at the one end portion or the other end portion of each of the resistors R1 to RQ as the bias voltages B1 to BQ to a gate terminal (a control terminal) of a transistor Q3 of each of the amplifiers AP1 to APQ corresponding to each of the bias voltages B1 to BQ. It should be noted that the amplifiers AP1 to APQ constitute a left region amplifier group responsible for a display drive of a left region screen of the display portion 20.

In the first embodiment, similar to the bias voltage generating portion 30a, the bias voltage generating portion 30b is configured to generate the bias voltage VBH on the high potential side and the bias voltage VBL on the low potential side having a potential lower than the bias voltage VBH. The bias voltage amplifier 31b is configured to amplify the bias voltage VBH generated with the bias voltage generating portion 30b to obtain a potential, and to supply the potential thus obtained to one end portion of the bias voltage supplying path 33b. The bias voltage amplifier 32b is configured to amplify the bias voltage VBL generated with the bias voltage generating portion 30b to obtain a potential, and to supply the potential thus obtained to the other end portion of the bias voltage supplying path 33b.

As shown in FIG. 3, the bias voltage supplying path 33b includes a voltage dividing resistor portion formed of resistors RQ+1 to Rn connected in series. In the bias voltage supplying path 33b, one end portion of the resistor Rn corresponds to the one end portion of the bias voltage supplying path 33b, and one end portion of the resistor RQ+1 corresponds to the other end portion of the bias voltage supplying path 33b.

In the first embodiment, in the bias voltage supplying path 33b, the other end portion of the resistor Rn is connected to one end portion of the resistor Rn-1, so that a voltage at a connecting point of the resistors Rn and Rn-1 is supplied to the amplifier APn as a bias voltage Bn. Further, in the bias voltage supplying path 33b, the other end portion of the resistor Rn-1 is connected to one end portion of the resistor Rn-2, so that a voltage at a connecting point of the resistors Rn and Rn-1 is supplied to the amplifier APn-1 as a bias voltage Bn-1. Accordingly, in the bias voltage supplying path 33b, the other end portion of the resistor RM (M is an integer from n to Q+1) is connected to one end portion of the resistor RM-1, so that a voltage at a connecting point of the resistors RM and RM-1 is supplied to the amplifier APM as a bias voltage BM.

With the configuration described above, the bias voltage supplying path 33b divides the voltages with the resistors RQ+1 to Rn based on the bias voltage VBH on the high potential side and the bias voltage VBL on the low potential side, so that the bias voltage supplying path 33b generates the bias voltages BQ+1 to Bn. Further, the bias voltage supplying path 33a supplies the bias voltages BQ+1 to Bn to the amplifiers APQ+1 to APn corresponding to the bias voltages BQ+1 to Bn.

In the first embodiment, the bias voltages BQ+1 to Bn have the following relationship:

$$Bn>Bn-1>Bn-2> \ldots >BQ+2>BQ+1$$

More specifically, the bias voltage supplying path 33a is configured to supply the voltages at the one end portion or the other end portion of each of the resistors RQ+1 to Rn as the bias voltages BQ+1 to Bn to a gate terminal (a control terminal) of a transistor Q3 of each of the amplifiers APQ+1 to APn corresponding to each of the bias voltages BQ+1 to Bn. It should be noted that the amplifiers APQ+1 to APn constitute a right region amplifier group responsible for a display drive of a right region screen of the display portion 20.

In the first embodiment, each of the amplifiers AP1 to APn is an individual separate output amplifier, and has an identical configuration. Further, the amplifiers AP1 to APn are arranged in a row along one side of the semiconductor chip of the source driver 13. Further, the amplifiers AP1 to APn are configured to amplify the gradation voltages V1 to Vn supplied from the gradation voltage conversion circuit 133 with a gain of one, so that the amplifiers AP1 to APn obtain the pixel drive voltages G1 to Gn. Then, the amplifiers AP1 to APn are configured to apply the pixel drive voltages G1 to Gn to the source lines D1 to Dn of the display portion 20 through the external wirings U1 to Un, respectively.

In the first embodiment, each of the amplifiers AP1 to APn has a bias voltage input terminal for inputting the bias voltage for controlling an electrical current to be flown to a differential stage of an operation amplifier, that is, an internal operation electrical current. Accordingly, the amplifiers AP1 to APn are configured to individually set the internal operation electrical current according to the bias voltages B1 to Bn individually supplied thereto through the bias voltage supplying path 33a and the bias voltage supplying path 33b. It should be noted that, when the bias voltage supplied to the bias voltage input terminal is high, the internal operation electrical current becomes high, so that an output electrical current capacity of the amplifier is increased. When the output electrical current capacity of the amplifier is increased, the amplifier is operated at a higher speed, thereby decreasing the output delay time.

Figure 4:
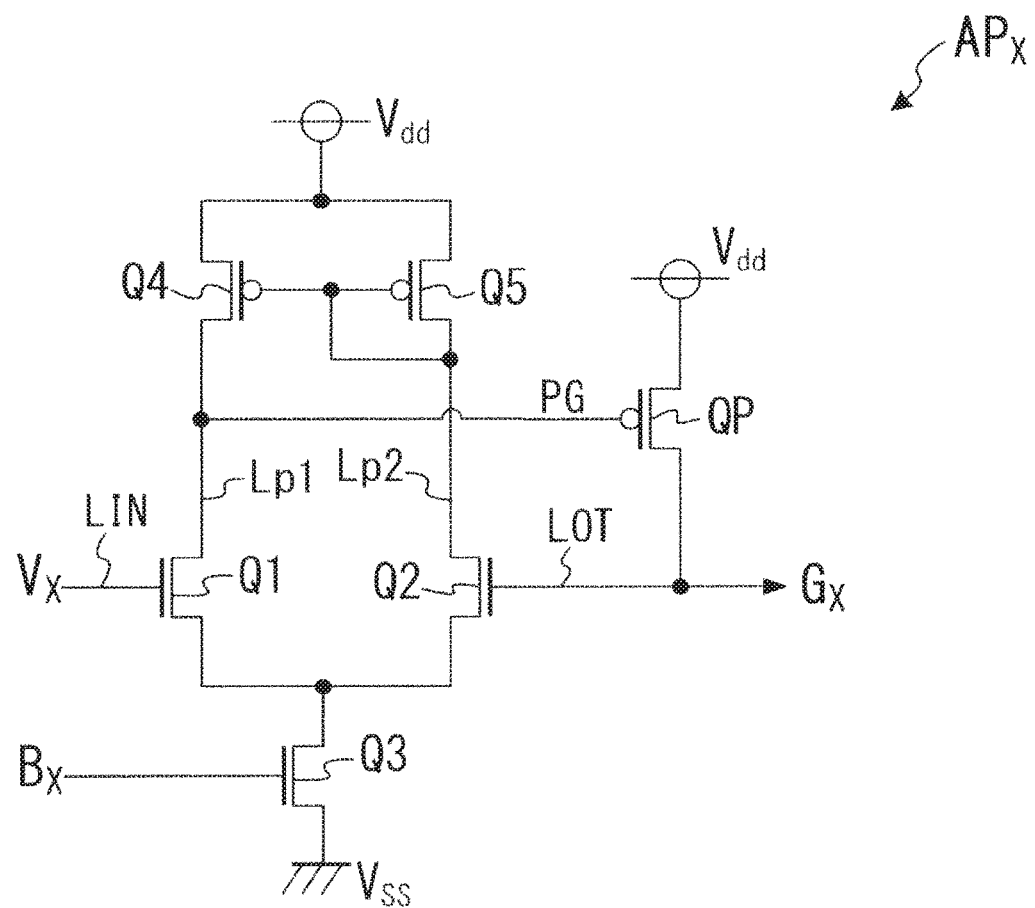
FIG. 4 is a circuit diagram showing an internal configuration of each of amplifiers of the source driver according to the first embodiment of the present invention.

FIG. 4 is a circuit diagram showing an internal configuration of each of the amplifiers AP1 to APn of the source driver 13 according to the first embodiment of the present invention.

As shown in FIG. 4, the amplifier APX (X is an integer from one to n) is an operation amplifier formed of transistors Q1 to Q3 of an n-channel MOS (Metal Oxide Semiconductor) type; a differential stage including transistors Q4 and Q5 of a p-channel MOS type; and an output stage including a transistor QP of the p-channel MOS type.

In the first embodiment, the transistors Q1 and Q2 constitute a differential pair. Further, the gradation voltage VX supplied from the gradation voltage conversion circuit 133 is applied to a gate terminal of the transistor Q1 through an input line LIN, and an output line LOUT is connected to a gate terminal of the transistor Q2. The transistor Q3 is configured as a bias transistor, and a drain terminal of the transistor Q3 is connected to a gate terminal of each of the transistors Q1 and Q2.

In the first embodiment, it is configured such that the bias voltage BX supplied from the bias voltage supplying path 33a is supplied to a gate terminal of the transistor Q3, and a ground voltage VSS (for example, zero bolt) is applied to a source terminal of the transistor Q3. Further, a drain terminal of the transistor Q1 is connected to a drain terminal of the transistor Q4 and a gate terminal of the transistor QP through a line LP1. Further, a drain terminal of the transistor Q2 is connected to a gate terminal of each of the transistors Q4 and Q5, and a drain terminal of the transistor Q5 through a line LP2. A power source voltage Vdd is applied to a source terminal of each of the transistors Q4 and Q5. Further, the power source voltage Vdd is applied to a source terminal of the transistor QP, and a drain terminal of the transistor QP is connected to the output line LOT.

In the amplifier APX having the configuration shown in FIG. 4, the transistor Q1 is configured to flow a first electrical current corresponding to the voltage value of the gradation voltage VX to a line Lp1. The transistor Q2 is configured to flow a second electrical current corresponding to the pixel drive voltage GX supplied through the output line LOT to a line Lp2. Accordingly, an output voltage drive signal PD is generated in the line Lp1, and the output voltage drive signal PD has a voltage value corresponding to a difference between the gradation voltage VX and the voltage of the output line LOT. Further, the output voltage drive signal PD is supplied to the gate terminal of the transistor QP. The transistor QP is configured to supply the output electrical current to the output line LOT according to the output voltage drive signal PD. Accordingly, the transistor QP generates the pixel drive voltage GX having the voltage value corresponding to the gradation voltage VX in the output line LOT.

In the first embodiment, as described above, the first electrical current and the second electrical current flow in the line Lp1 and the line Lp2 of the amplifier APX. It should be noted that levels of the first electrical current and the second electrical current are determined according to a drain-source electrical current of the transistor Q3 of the amplifier APX. More specifically, the transistor Q3 is configured to function as the bias transistor of the amplifier APX, so that the transistor Q3 is configured to adjust the levels of the first electrical current and the second electrical current flowing through the lines Lp1 and Lp2 of the amplifier APX according to the bias voltage BX supplied to the gate terminal (the control terminal) of the transistor Q3.

In the first embodiment, when the bias voltage BX supplied to the gate terminal (the control terminal) of the transistor Q3 is increased, the levels of the first electrical current and the second electrical current, that is, an internal operation electrical current, flowing through the lines Lp1 and Lp2 are increased. As a result, the output electrical current capacity of the amplifier APX is increased.

In the first embodiment, when the output electrical current capacity of the amplifier APX is increased, the voltage rising period of the pixel drive voltage GX generated with the amplifier APX is shortened. More specifically, when the bias voltage BX supplied to the gate terminal (the control terminal) of the transistor Q3 is increased, the output delay time of the amplifier APX is shortened.

In the first embodiment, the output circuit 134 having the configuration shown in FIG. 3 includes an output electrical current capacity setting portion formed of the bias voltage generating portion 30a and the bias voltage supplying path 33a (or the bias voltage generating portion 30b and the bias voltage supplying path 33b). The output electrical current capacity setting portion is configured to individually set the output electrical current capacity of each of the amplifiers AP1 to APQ (or the amplifiers APQ+1 to APn) that output the pixel drive voltages G1 to GQ (or the pixel drive voltages GQ+1 to Gn) to the display portion 20.

Figure 5:
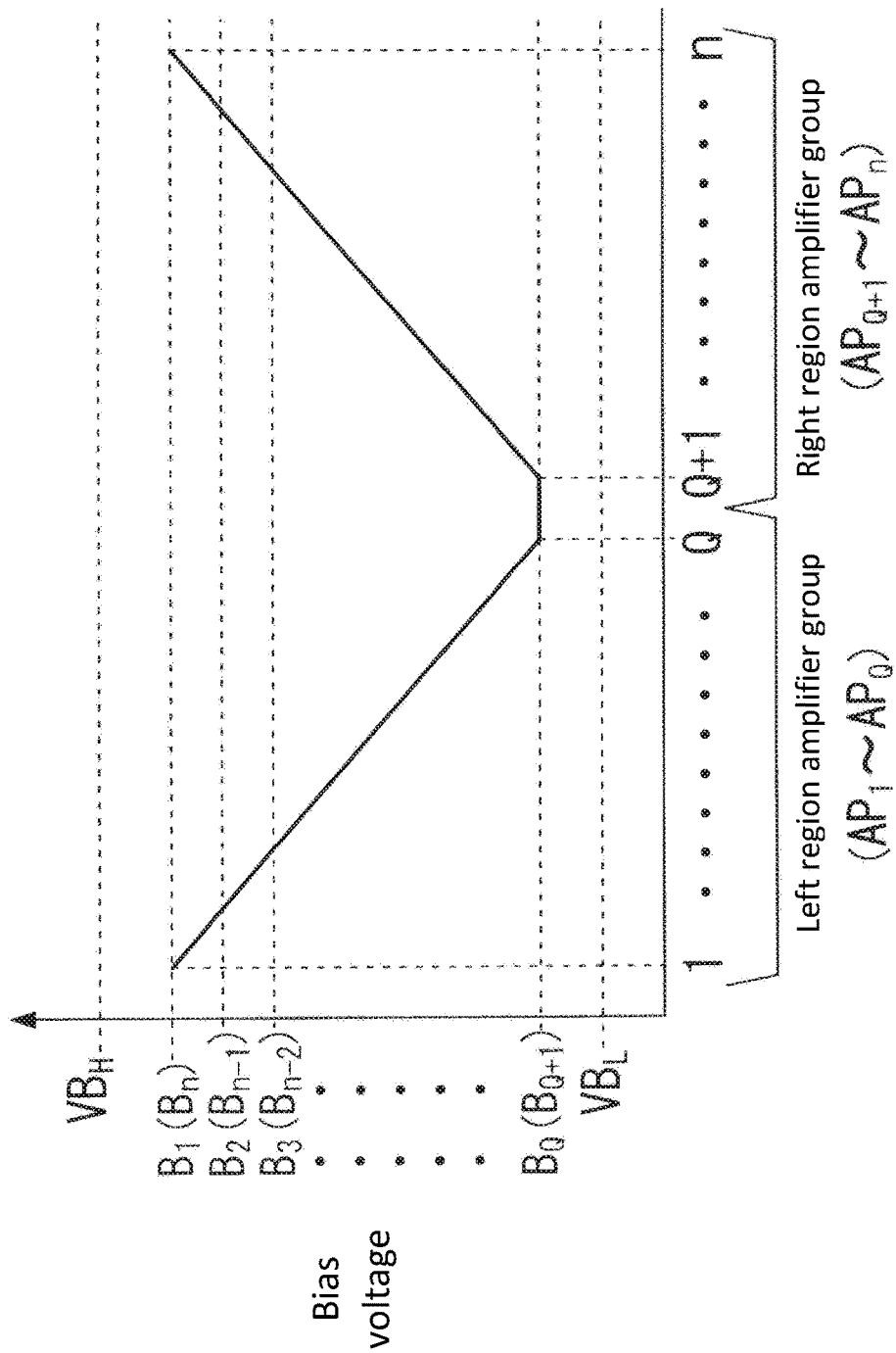
FIG. 5 is a graph showing a bias voltage supplied to each of the amplifiers of the source driver according to the first embodiment of the present invention.

FIG. 5 is a graph showing the bias voltages B1 to BQ supplied to each of the amplifiers AP1 to APQ of the source driver 13 according to the first embodiment of the present invention.

In the first embodiment, the bias voltage supplying path 33a supplies the bias voltages B1 to BQ to the amplifiers AP1 to APQ constituting the left region amplifier group, and the bias voltages B1 to BQ have the levels shown in FIG. 5. Further, the bias voltage supplying path 33b supplies the bias voltages BQ+1 to Bn to the amplifiers APQ+1 to APn constituting the right region amplifier group, and the bias voltages BQ+1 to Bn have the levels shown in FIG. 5.

Accordingly, the amplifiers AP1 and APn, which perform display drive at both ends of the screen, have the shortest output delay time, and the output delay time of the amplifier AP is increased toward the center of the screen. In other words, among the amplifiers AP1 to APQ constituting the left region amplifier group, the amplifier AP1 has the shortest output delay, and the output delay is increased in the following order:

$$AP2 > AP3 > \ldots > APQ-1 > APQ$$

Further, among the amplifiers APQ+1 to APn constituting the right region amplifier group, the amplifier APn has the shortest output delay, and the output delay is increased in the following order:

$$APn-1 > APn-2 > \ldots > APQ+2 > APQ+1$$

As described above, in the first embodiment, among the external wirings U1 to UQ connected to each of the amplifiers AP1 to APQ, the external wirings U1 has the largest transmission delay, and the transmission delay is decreased in the following order:

$$U2 > U3 > \ldots > UQ-1 > UQ$$

Further, among the external wirings UQ+1 to Un connected to each of the amplifiers APQ+1 to APn, the external wirings Un has the largest transmission delay, and the transmission delay is decreased in the following order:

$$Un-1 > Un-2 > \ldots > UQ+2 > UQ+1$$

Accordingly, in the first embodiment, it is possible to obtain a constant total time of the transmission delay time of the external wirings UX (X is an integer from one to n) and the output delay time of the amplifiers APX. More specifically, it is possible to obtain the constant delay time of the pixel drive voltages G1 to Gn supplied from the source driver 13 to reach the display portion 20 through the external wirings U1 to Un corresponding to each of the pixel drive voltages G1 to Gn.

In the first embodiment, with the output circuit 134 having the configuration shown in FIG. 3, it is possible to minimize the difference in the timing of the pixel drive voltages G1 to Gn supplied from the source driver 13 to apply to the source lines D1 to Dn of the display portion 20. Accordingly, it is possible to display an image on the display device 20 while minimizing the display variance.

Second Embodiment

A second embodiment of the present invention will be explained next with reference to FIG. 6. As described above, in the first embodiment, the source driver 13 is configured to individually set the internal operation electrical current of each of the amplifiers AP1 to APQ (or the amplifiers APQ+1 to APn), so that the output delay time of each of the amplifiers AP1 to APQ (or the amplifiers APQ+1 to APn) is individually adjusted. Alternatively, the source driver 13 may be configured to set the output delay time of each of the amplifiers AP1 to APQ (or the amplifiers APQ+1 to APn) with a different configuration.

Figure 6:
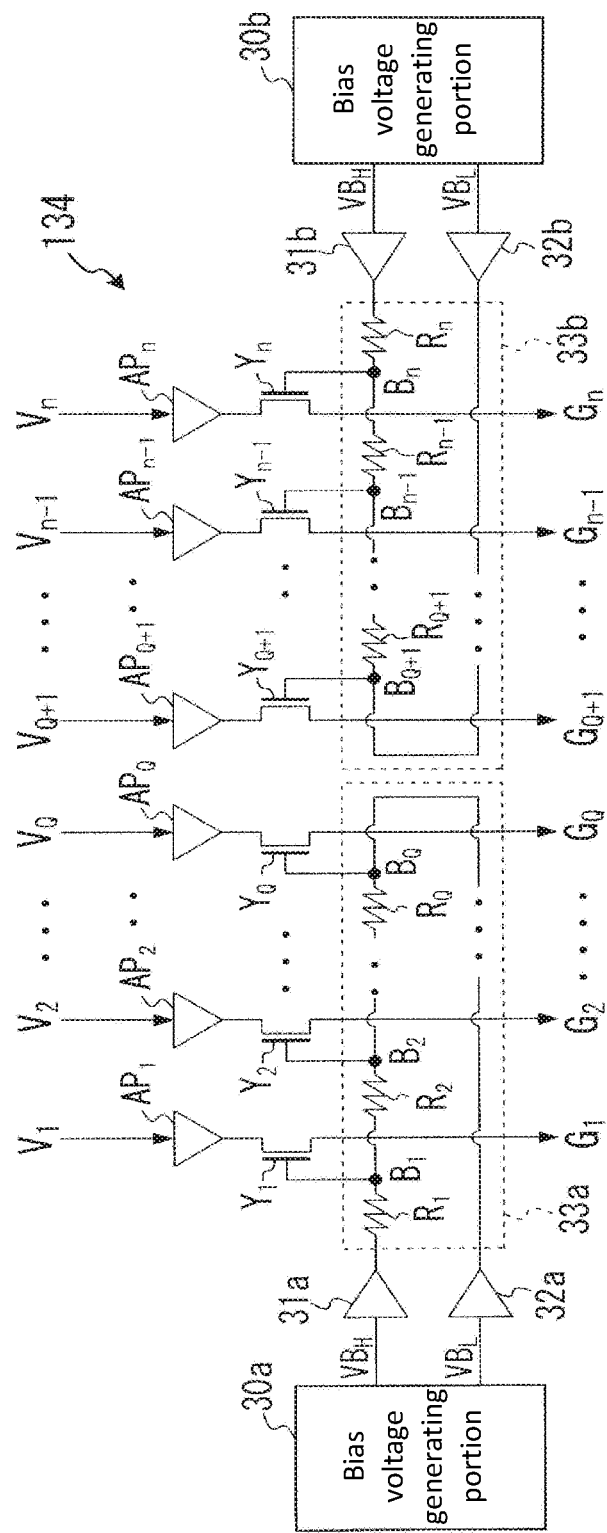
FIG. 6 is a block diagram showing an internal configuration of an output circuit according to a second embodiment of the present invention.

FIG. 6 is a block diagram showing an internal configuration of the output circuit 134 according to the second embodiment of the present invention.

In the second embodiment, as shown in FIG. 6, in addition to the configuration shown in FIG. 3 in the first embodiment, the output circuit 134 further includes transistors Y1 to Yn of the n-channel MOS type each functioning as an output electrical current adjusting transistor. It should be noted that other configuration of the output circuit 134 in the second embodiment is similar to that of the output circuit 134 in the first embodiment, except that, in the output circuit 134 in the second embodiment, a fixed bias voltage having a specific voltage value is applied to the gate terminal of the transistor Q3 of each of the amplifiers AP1 to APn.

In the second embodiment, in the output circuit 134 having the configuration shown in FIG. 6, the output terminal of each of the amplifiers AP1 to APn is connected to a source terminal of each of the corresponding transistors Y1 to Yn. Further, the bias voltage supplying path 33*a* is configured to supply the bias voltages B1 to BQ having the levels shown in FIG. 5 to a gate terminal (a control terminal) of each of the corresponding transistors Y1 to YQ. Further, the bias voltage supplying path 33*b* is configured to supply the bias voltages BQ+1 to Bn having the levels shown in FIG. 5 to a gate terminal (a control terminal) of each of the corresponding transistors YQ+1 to Yn.

In the second embodiment, the transistors Y1 to Yn are configured to set in an on state according to the bias voltage applied to the gate terminals thereof. Accordingly, when the amplifier APX (X is an integer from one to n) supplies the output electrical current, the transistor YX (X is an integer from one to n) adjusts the output electrical current an adjusted electrical current according to the bias voltage BX, and supplies the adjusted electrical current to the external wiring UX through the drain terminal thereof. As a result, the transistor YX generates the pixel drive voltage GX in the external wiring UX.

In the second embodiment, when the electrical current supplied from the transistor YX (X is an integer from one to n) is increased, the rising period of the pixel drive voltage GX is shortened, thereby shortening the output delay time of the pixel drive voltage GX.

In the second embodiment, a pair of the amplifier APX and the transistor YX may be considered as one single output amplifier. In this case, it is possible to individually set the output electrical current capacity of each of the first to the n-th output amplifiers (the amplifiers AP1 to APn and the transistors Y1 to Yn) according to the bias voltages B1 to Bn supplied from the bias voltage generating portion 30*a*, the bias voltage generating portion 30*b*, the bias voltage supplying path 33*a*, and the bias voltage supplying path 33*b*.

In the second embodiment, when the bias voltages B1 to Bn shown in FIG. 5 are supplied, the output delay time of the transistor Y1 (or the transistor Yn) connected to the amplifier AP1 (of the amplifier APn) responsible for the display drive at the both end portions of the display portion 20 becomes the shortest. Further, the output delay time of the transistor Y connected to the amplifier AP is increased toward the center of the display portion 20.

Accordingly, in the second embodiment, with the output circuit 134 having the configuration shown in FIG. 6, similar to the output circuit 134 having the configuration shown in FIG. 3 in the first embodiment, it is possible to obtain the constant delay time of the pixel drive voltages G1 to Gn supplied from the source driver 13 to reach the display portion 20 through the external wirings U1 to Un corresponding to each of the pixel drive voltages G1 to Gn. Accordingly, it is possible to display an image on the display device 20 while minimizing the display variance.

Third Embodiment

A third embodiment of the present invention will be explained next with reference to FIG. 7. As described above, in the first embodiment, the bias voltage supplying path 33*a* (or the bias voltage supplying path 33*b*) is configured to supply the bias voltages B1 to BQ (or the bias voltages BQ+1 to Bn) having the different voltage values to the amplifiers AP1 to APQ (or the amplifiers APQ+1 to APn). Alternatively, the bias voltage supplying path 33*a* (or the bias voltage supplying path 33*b*) may be configured to supply the bias voltages B1 to BQ (or the bias voltages BQ+1 to Bn) having the different voltage values with a different configuration.

Figure 7:
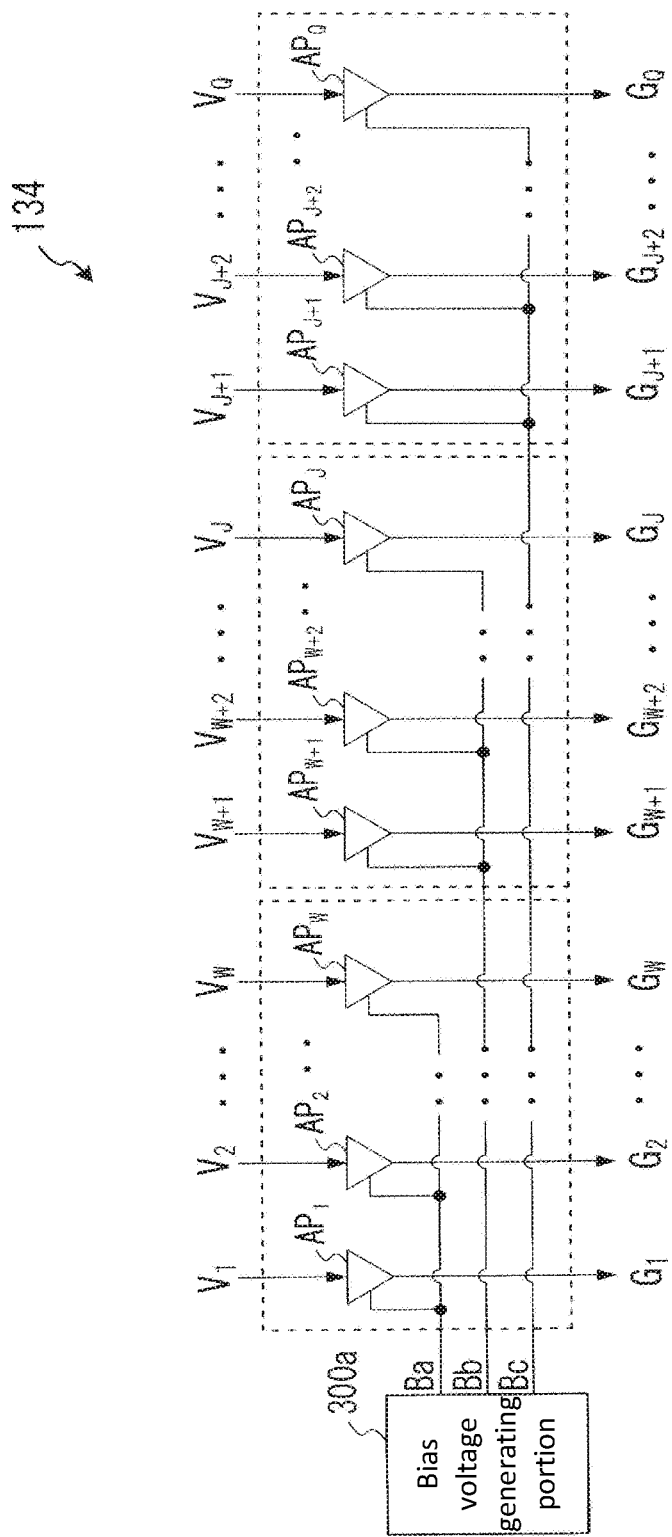
FIG. 7 is a block diagram showing an internal configuration of an output circuit according to a third embodiment of the present invention.

FIG. 7 is a block diagram showing an internal configuration of the output circuit 134 according to the third embodiment of the present invention. It should be noted that, in FIG. 7, only the amplifiers AP1 to APQ constituting the left region amplifier group are shown.

As shown in FIG. 7, different from the output circuit 134 having the configuration shown in FIG. 3, the output circuit 134 does not include the bias voltage supplying path 33*a*, the bias voltage amplifier 31*a*, and the bias voltage amplifier 32*a*. Further, the output circuit 134 includes a bias voltage generating portion 300*a* instead of the bias voltage generating portion 30*a* shown in FIG. 3.

In the third embodiment, the bias voltage generating portion 300*a* is configured to generate the bias voltages Ba to Bc having the following relationship:

$$Ba > Bb > Bc$$

In the third embodiment, the bias voltage generating portion 300*a* is configured to supply the bias voltage Ba to each of the amplifiers AP1 to APW (W is an integer smaller than Q) constituting a first group among the amplifiers AP1 to APQ constituting the left region amplifier group. Further, the bias voltage generating portion 300*a* is configured to supply the bias voltage Bb to each of the amplifiers APW+1 to APJ (J is an integer greater than W and smaller than Q) constituting a second group responsible for the display drive of a region closer to the center of the display portion 20 than the first group. Further, the bias voltage generating portion 300*a* is configured to supply the bias voltage Bc to each of the amplifiers APJ+1 to APQ constituting a third group responsible for the display drive of a region closer to the center of the display portion 20 than the second group.

More specifically, in the third embodiment, with the output circuit 134 having the configuration shown in FIG. 7, it is configured to set the output delay time of the amplifiers AP1 to APn per group according to the transmission delay of the external wirings U1 to Un. Accordingly, it is possible to minimize the difference in the timing of the pixel drive voltages G1 to Gn supplied from the source driver 13 to reach the source lines D1 to Dn of the display portion 20. Accordingly, it is possible to display an image on the display device 20 while minimizing the display variance.

In the third embodiment, each of the amplifiers AP1 to APn has the internal configuration, in which the output stage of the operation amplifier is formed of the single amplifier configuration. Alternatively, the output stage of the operation amplifier may be formed of a push-pull amplifier configuration.

Fourth Embodiment

A fourth embodiment of the present invention will be explained next with reference to FIG. 8. As described above, in the first embodiment, it is configured to set the output delay time of each of the amplifiers AP1 to APn according to the bias voltages B1 to Bn supplied to each of the amplifiers AP1 to APn. In the fourth embodiment, each of the amplifiers AP1 to APn is configured to individually obtain a desirable output delay time.

Figure 8:
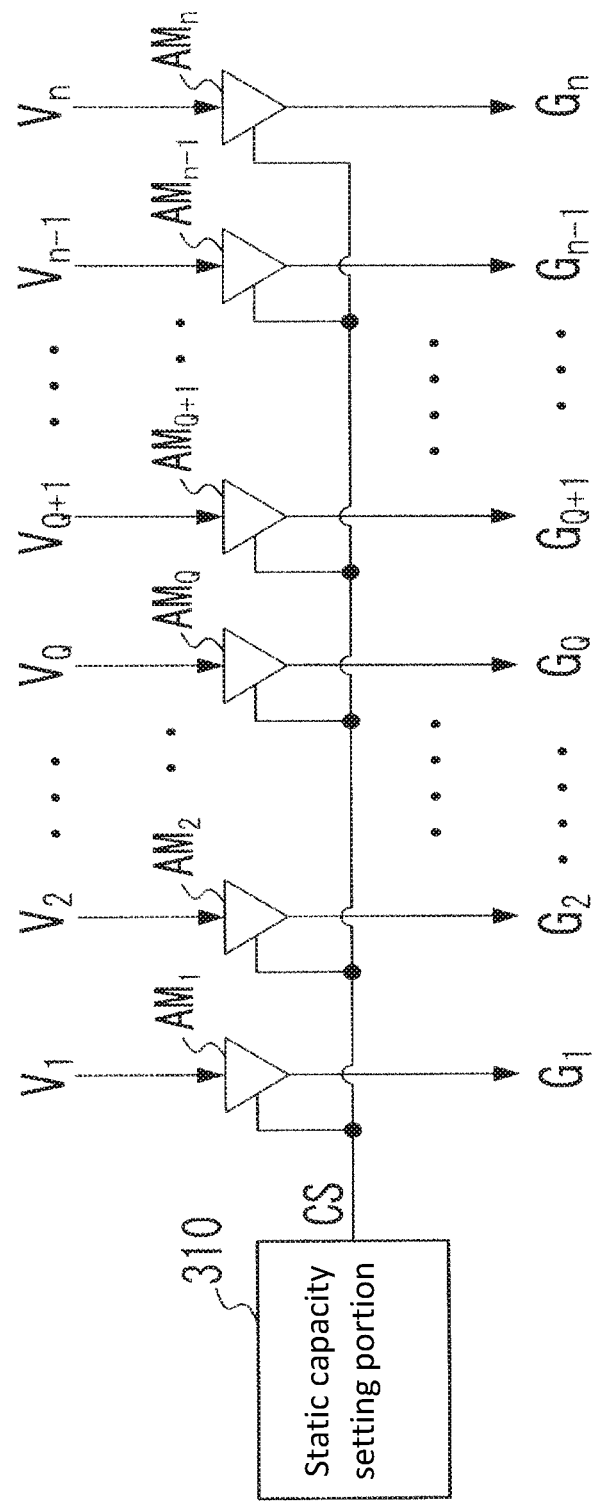
FIG. 8 is a block diagram showing an internal configuration of an output circuit according to a fourth embodiment of the present invention.

FIG. 8 is a block diagram showing an internal configuration of the output circuit 134 according to the fourth embodiment of the present invention. As shown in FIG. 8, the output circuit 134 includes amplifiers AM1 to AMn and a static capacity setting portion 310.

In the fourth embodiment, the amplifiers AM1 to AMn are configured to individually amplify the gradation voltages V1 to Vn to generate the pixel drive voltages G1 to Gn. The static capacity setting portion 310 is configured as the output electrical current capacity setting portion to set the output electrical current capacity of each of the amplifiers AM1 to AMn.

In the fourth embodiment the static capacity setting portion 310 is configured to generate a static capacity change signal CS specifying whether a static capacity of a capacitor disposed in each of the amplifiers AM1 to AMn for a phase compensation is changed or not. Further, the static capacity setting portion 310 is configured to supply the static capacity change signal CS with a binary level to each of the amplifiers AM1 to AMn.

More specifically, when the static capacity of the capacitor for the phase compensation is changed, the static capacity setting portion 310 is configured to supply the static capacity change signal CS having a logic level of zero to each of the amplifiers AM1 to AMn. Further, when the static capacity of the capacitor for the phase compensation is not changed, the static capacity setting portion 310 is configured to supply the static capacity change signal CS having a logic level of one to each of the amplifiers AM1 to AMn.

Figure 9:
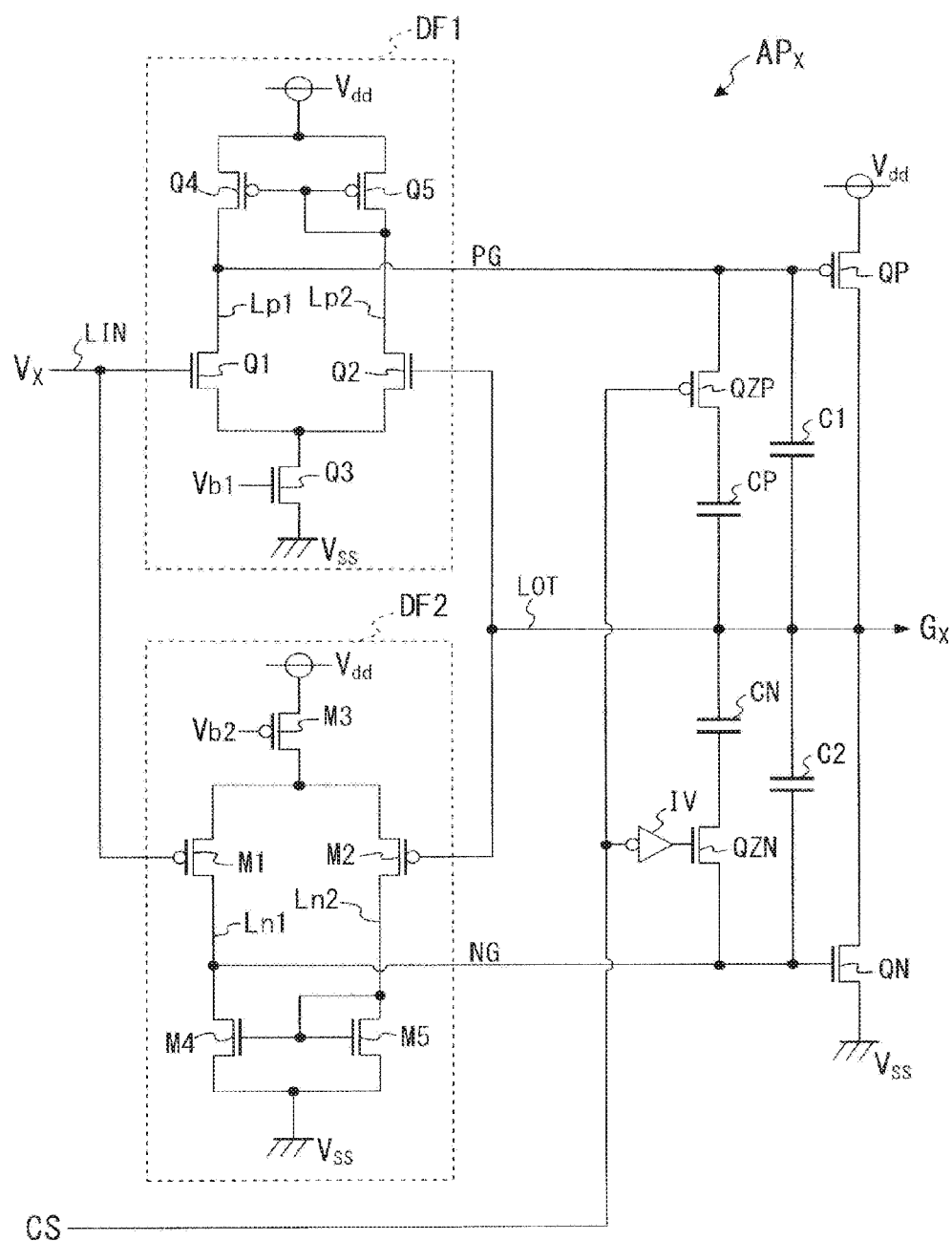
FIG. 9 is a circuit diagram showing an internal configuration of each of amplifiers of the output circuit according to the fourth embodiment of the present invention.

FIG. 9 is a circuit diagram showing an internal configuration of each of the amplifiers AM1 to AMn of the output circuit 134 according to the fourth embodiment of the present invention.

As shown in FIG. 9, the amplifier AMX (X is an integer from one to n) is an operation amplifier formed of a push pull stage; a first differential stage DF1 for driving an output transistor QP of the p-channel MOS type; a second differential stage DF2 for driving an output transistor QN of the n-channel MOS type; and capacitors C1 and C21 for the phase compensation. The push pull stage includes the transistors QP and QN.

In the fourth embodiment, the amplifier AMX further includes an inverter IV; additional capacitors CP and CN for changing the static capacity of the capacitors C1 and C21 for the phase compensation; a transistor QZP of the p-channel MOS type as a control transistor; and a transistor QZN of the n-channel MOS type as a control transistor.

In the fourth embodiment, the first differential stage DF1 has a circuitry configuration similar to that of the transistors Q1 to Q5 shown in FIG. 4. Further, the transistor QP has a circuitry configuration similar to that of the transistor QP shown in FIG. 4. It should be noted that a fixed bias voltage Vb1 having a specific voltage value is applied to the gate terminal of the transistor Q3.

In the fourth embodiment, the second differential stage DF2 includes transistors M1 to M3 of the p-channel MOS type and transistors M4 and M5 of the n-channel MOS type. The transistors M1 and M2 are configured to be a differential pair. The gradation voltage VX (X is an integer from one to n) supplied from the gradation voltage conversion circuit 133 is applied to a gate terminal of the transistor M1 through an input line LIN. An output line LOT is connected to a gate terminal of the transistor M2.

In the fourth embodiment, a drain terminal of the transistor M3 is connected to source terminals of the transistors M1 and M2. A fixed bias voltage Vb2 having a specific voltage value is applied to the gate terminal of the transistor M3, and the power source voltage V is applied to the source terminal of the transistor M3. A drain terminal of the transistor M1 is connected to a drain terminal of the transistor M4 and a gate terminal (or a control terminal) of the output transistor QN through a line Ln1. A drain terminal of the transistor M2 is connected to gate terminals of the transistors M4 and M5 and a drain terminal of the transistor M5 through a line Ln2. The ground voltage VSS is applied to source terminals of the transistors M4 and M5. It should be noted that the ground voltage VSS is also applied to a source terminal of the transistor QN, and a drain terminal of the transistor QN is connected to the output line LOT.

In the fourth embodiment, the transistor M1 is configured to flow an electrical current corresponding to the voltage value of the gradation voltage VX to the line Ln1. The transistor M2 is configured to flow an electrical current corresponding to the pixel drive voltage GX supplied thereto through the line Ln1 to the line Ln2. Accordingly, an output voltage drive signal NG is generated in the line Ln1 such that the output voltage drive signal NG has a voltage value corresponding to a difference between the gradation voltage VX and the voltage of the output line LOT. Further, the output voltage drive signal NG is supplied to the gate terminal of the transistor QN. Accordingly, the transistor QN is configured to extract the output electrical current corresponding to the output voltage drive signal NG from the output line LOT, so that the transistor QN generates the gradation voltage GX having the voltage value corresponding to the gradation voltage VX in the output line LOT.

As shown in FIG. 9, in the amplifier AMX, the source terminal of the transistor QZP is connected to the gate terminal of the output transistor QP, and the drain terminal of the transistor QZP is connected to one end portion of the additional capacitor CP. The other end portion of the additional capacitor CP is connected to the output line LOT. Further, the source terminal of the transistor QZN is connected to the gate terminal of the output transistor QN, and the drain terminal of the transistor QZN is connected to one end portion of the additional capacitor CN. The other end portion of the additional capacitor CN is connected to the output line LOT.

In the fourth embodiment, the static capacity change signal CS is supplied to the gate terminal of the transistor QZP. Further, the inverter IV is configured to invert the logic level of the static capacity change signal CS, and a signal with the inverted logic level is supplied to the gate terminal of the transistor QZN.

An operation of the amplifier AMX shown in FIG. 9 for setting the static capacity will be explained next.

First, when the static capacity setting portion 310 supplies the static capacity change signal CS having the logic level of zero, the transistor QZP and the transistor QZN are turned on. Accordingly, the additional capacitor CP and the additional capacitor CN become the state that the additional capacitor CP is connected to the capacitor C1 in parallel, and the additional capacitor CN is connected to the capacitor C2 in parallel. As a result, the static capacity for the phase compensation is equal to the sum of the static capacity of the capacitor C1 (or the capacitor C2) and the static capacity of the additional capacitor CP (or the additional capacitor CN).

On the other hand, when the static capacity setting portion 310 supplies the static capacity change signal CS having the logic level of one, the transistor QZP and the transistor QZN are turned off. Accordingly, the additional capacitor CP and the additional capacitor CN are cut off. As a result, the static capacity for the phase compensation is equal to the static capacity of the capacitor C1 (or the capacitor C2).

In the fourth embodiment, it should be noted that the capacitor C1 (or the capacitor C2) for the phase compensation disposed in each of the amplifiers AM1 to AMn has an identical static capacity. However, the additional capacitor CP (or the additional capacitor CN) disposed in each of the amplifiers AM1 to AMn has a different static capacity per each of the amplifiers AM1 to AMn.

More specifically, the additional capacitor CP (or the additional capacitor CN) disposed in the amplifiers AM1 and AMn responsible for the display drive at the both end portions of the display portion 20 has a smallest static capacity. Further, the static capacity of the additional capacitor CP (or the additional capacitor CN) disposed in the amplifiers AMX is increased toward the center of the display portion 20. When the static capacity for the phase compensation is increased, the output electrical current capacity of the amplifier AMX is decreased, thereby increasing the output delay time thereof.

In the fourth embodiment, during the time when the static capacity change signal CS having the logic level of zero, which indicates the static capacity for the phase compensation is changed, is supplied to each of the amplifiers AM1 to AMn, among the amplifiers AM1 to AMQ constituting the left region amplifier group, the amplifier AM1 has the smallest output delay time, and the output delay of the amplifier AM is increased in the following order:

$$AM2 > AM3 > \ldots > AMQ-1 > AMQ$$

Further, among the amplifiers AMQ+1 to AMn constituting the right region amplifier group, the amplifier AMn has the smallest output delay, and the output delay is increased in the following order:

$$AMn-1 > AMn-2 > \ldots > AMQ+2 > AMQ+1$$

In the fourth embodiment, with the output circuit 134 having the configuration shown in FIGS. 8 and 9, it is possible to minimize the difference in the timing of the pixel drive voltages G1 to Gn supplied from the source driver 13 to apply to the source lines D1 to Dn of the display portion 20 through the external wirings U1 to Un. Accordingly, it is possible to display an image on the display device 20 while minimizing the display variance.

In summary, in the embodiments described above, it is suffice that the source driver 13 includes the first to the n-th output amplifiers (the amplifiers AP1 to APQ and APQ+1 to APn, or the amplifiers AM1 to AMQ and AMQ+1 to AMn) and the output electrical current setting portion (the bias voltage generating portion 30a, the bias voltage generating portion 30b, the bias voltage supplying path 33a, the bias voltage supplying path 33b, the bias voltage generating portion 300a, or the static capacity setting portion 310).

More specifically, the first to the n-th output amplifiers (the amplifiers AP1 to APQ and APQ+1 to APn, or the amplifiers AM1 to AMQ and AMQ+1 to AMn) are configured to amplify the first to the n-th gradation voltages V1 to VQ and VQ+1 to Vn representing the brightness level per pixel according to the video signal to obtain the first to the n-th pixel drive voltages G1 to GQ and GQ+1 to Gn. Further, the first to the n-th output amplifiers (the amplifiers AP1 to APQ and APQ+1 to APn, or the amplifiers AM1 to AMQ and AMQ+1 to AMn) are configured to output the first to the n-th pixel drive voltages G1 to GQ and GQ+1 to Gn to the display portion 20. The output electrical current setting portion (the bias voltage generating portion 30a, the bias voltage generating portion 30b, the bias voltage supplying path 33a, the bias voltage supplying path 33b, the bias voltage generating portion 300a, or the static capacity setting portion 310) is configured to set the output electrical current capacity of each of the first to the n-th output amplifiers individually or per group.

Further, in the first and second embodiments, as shown in FIGS. 3 and 6, the output electrical current setting portion (the bias voltage generating portion 30a, the bias voltage generating portion 30b, the bias voltage supplying path 33a, or the bias voltage supplying path 33b) is configured to supply the bias voltages B1 to BQ (or the bias voltages BQ+1 to Bn) to the amplifiers AP1 to APQ (or the amplifiers APQ+1 to APn) to set the output electrical current capacity of the amplifiers AP1 to APQ (or the amplifiers APQ+1 to APn). The present invention is not limited to the configuration.

In the first and second embodiments, it is suffice that the output electrical current setting portion (the bias voltage generating portion 30a, the bias voltage generating portion 30b, the bias voltage supplying path 33a, or the bias voltage supplying path 33b) is configured to generate the first to the n-th setting signals corresponding to the first to the n-th output amplifiers (the amplifiers AP1 to APQ and APQ+1 to APn). Further, it is suffice that the output electrical current setting portion (the bias voltage generating portion 30a, the bias voltage generating portion 30b, the bias voltage supplying path 33a, or the bias voltage supplying path 33b) is configured to set the output electrical current capacity of the first to the n-th output amplifiers (the amplifiers AP1 to APQ and APQ+1 to APn) through supplying the first to the n-th setting signals to the first to the n-th output amplifiers (the amplifiers AP1 to APQ and APQ+1 to APn).

Further, in the third embodiment, as shown in FIG. 7, the output electrical current setting portion 300a is configured to generate the bias voltages Ba, Bb, and Bc corresponding to the three groups of the amplifiers AP1 to APQ. Further, the output electrical current setting portion 300a is configured to supply the bias voltages Ba, Bb, and Bc to the three groups of the amplifiers AP1 to APQ to set the output electrical current capacity of the amplifiers AP1 to APQ. The present invention is not limited to the configuration.

In the third embodiment, it is suffice that the output electrical current setting portion 300a is configured to generate the first to the k-th setting signals (k is an integer greater than two and less that N/2) corresponding to the groups in the number of k of the first to the n-th output amplifiers (the amplifiers AP1 to APQ and APQ+1 to APn). Further, it is suffice that the output electrical current setting portion 300a is configured to set the output electrical current capacity of the first to the n-th output amplifiers (the amplifiers AP1 to APQ and APQ+1 to APn) through supplying the first to the k-th setting signals to the first to the n-th output amplifiers (the amplifiers AP1 to APQ and APQ+1 to APn).

The disclosure of Japanese Patent Application No. 2016-067098, filed on Mar. 30, 2016, is incorporated in the application by reference.

While the invention has been explained with reference to the specific embodiments of the invention, the explanation is illustrative and the invention is limited only by the appended claims.

What is claimed is:

1. A display driver for driving a display device according to a video signal, comprising:
   a plurality of first to N-th output amplifiers (N is an integer greater than two) configured to amplify first to N-th gradation voltages each representing a brightness level per pixel according to the video signal so that the first to N-th output amplifiers obtain first to N-th pixel drive voltages; and
   an output electrical current capacity setting portion,
   wherein said first to N-th output amplifiers are configured to output the first to N-th pixel drive voltages to the display device,
   said output electrical current capacity setting portion is configured to set an output electrical current capacity of each of the first to N-th output amplifiers individually or in a group of a specific number of the first to N-th output amplifiers,
   each of said first to N-th output amplifiers includes an operation amplifier including:
   an input line for receiving one of the first to N-th gradation voltages;
   an output line for outputting one of the first to N-th pixel drive voltages;
   a differential stage for generating a drive signal according to a difference between the one of the first to N-th gradation voltages and a voltage of the output line;
   an output transistor for receiving the drive signal with a control terminal thereof and supplying an electrical current to the output line according to the drive signal so that the one of the first to N-th pixel drive voltages is generated in the output line;
   a phase compensation capacitor having one end portion connected to the control terminal of the output transistor and the other end portion connected to the output line;
   an additional capacitor having one end portion connected to the output line; and
   a control transistor configured to turn on or off according to a static capacity change signal so that the control terminal of the output transistor is connected to the other end portion of the additional capacitor when the control transistor is turned on,
   said output electrical current capacity setting portion includes a static capacity setting portion,
   said static capacity setting portion is configured to supply a binary signal indicating whether a static capacity of the phase compensation capacitor is changed as the static capacity change signal to each of the first to N-th output amplifiers, and
   said additional capacitor of each of the first to N-th output amplifiers has a different static capacity.

2. The display driver according to claim 1, wherein said output electrical current capacity setting portion is configured to generate first to N-th setting signals corresponding to the first to N-th output amplifiers, and
   said output electrical current capacity setting portion is configured to supply the first to N-th setting signals to the first to N-th output amplifiers so that the output electrical current capacity setting portion sets the output electrical current capacity of each of the first to N-th output amplifiers.

3. The display driver according to claim 1, wherein said output electrical current capacity setting portion is configured to generate first to k-th setting signals (k is an integer greater than two and less than 2/N) corresponding to the group of the number k of the first to N-th output amplifiers, and
   said output electrical current capacity setting portion is configured to supply the first to k-th setting signals to the first to N-th output amplifiers so that the output electrical current capacity setting portion sets the output electrical current capacity of each of the first to N-th output amplifiers.

4. A display driver for driving a display device according to a video signal, comprising:
   a plurality of first to N-th output amplifiers (N is an integer greater than two) configured to amplify first to N-th gradation voltages each representing a brightness level per pixel according to the video signal so that the first to N-th output amplifiers obtain first to N-th pixel drive voltages; and
   an output electrical current capacity setting portion,
   wherein said first to N-th output amplifiers are configured to output the first to N-th pixel drive voltages to the display device,
   said output electrical current capacity setting portion is configured to set an output electrical current capacity of each of the first to N-th output amplifiers individually or in a group of a specific number of the first to N-th output amplifiers,
   said output electrical current capacity setting portion is configured to set an output electrical current capacity of each of the first to N-th output amplifiers individually or in a group of a specific number of the first to N-th output amplifiers,
   said output electrical current capacity setting portion is configured to generate first to N-th setting signals corresponding to the first to N-th output amplifiers,
   said output electrical current capacity setting portion is configured to supply the first to N-th setting signals to the first to N-th output amplifiers so that the output electrical current capacity setting portion sets the output electrical current capacity of each of the first to N-th output amplifiers,
   each of said first to N-th output amplifiers includes an operation amplifier including:
   an input line for receiving one of the first to N-th gradation voltages;
   an output line for outputting one of the first to N-th pixel drive voltages;
   a first transistor for flowing a first electrical current in a first line according to the one of the first to N-th gradation voltages;

a second transistor for flowing a second electrical current in a second line according to a voltage of the output line;

a bias transistor for adjusting electrical current amounts of the second electrical current and the second electrical current according to a voltage of a control terminal thereof; and an output transistor for supplying a third electrical current to the output line according to a voltage of the first line so that the one of the first to N-th pixel drive voltages is generated in the output line, said output electrical current capacity setting portion is configured to generate first to N-th bias voltages as the first to N-th setting signals, and said output electrical current capacity setting portion is configured to supply one of the first to N-th bias voltages to the control terminal of the bias transistor of each of the first to N-th output amplifiers.

5. A display driver for driving a display device according to a video signal, comprising:

a plurality of first to N-th output amplifiers (N is an integer greater than two) configured to amplify first to N-th gradation voltages each representing a brightness level per pixel according to the video signal so that the first to N-th output amplifiers obtain first to N-th pixel drive voltages; and an output electrical current capacity setting portion, wherein said first to N-th output amplifiers are configured to output the first to N-th pixel drive voltages to the display device, said output electrical current capacity setting portion is configured to set an output electrical current capacity of each of the first to N-th output amplifiers individually or in a group of a specific number of the first to N-th output amplifiers, said output electrical current capacity setting portion is configured to generate first to k-th setting signals (k is an integer greater than two and less than 2/N) corresponding to the group of the number k of the first to N-th output amplifiers, said output electrical current capacity setting portion is configured to supply the first to k-th setting signals to the first to N-th output amplifiers so that the output electrical current capacity setting portion sets the output electrical current capacity of each of the first to N-th output amplifiers, each of said first to N-th output amplifiers includes an operation amplifier including:

an input line for receiving one of the first to N-th gradation voltages;

an output line for outputting one of the first to N-th pixel drive voltages;

a first transistor for flowing a first electrical current in a first line according to the one of the first to N-th gradation voltages;

a second transistor for flowing a second electrical current in a second line according to a voltage of the output line;

a bias transistor for adjusting electrical current amounts of the second electrical current and the second electrical current according to a voltage of a control terminal thereof; and an output transistor for supplying a third electrical current to the output line according to a voltage of the first line so that the one of the first to N-th pixel drive voltages is generated in the output line, said output electrical current capacity setting portion is configured to generate first to k-th bias voltages as the first to k-th setting signals, and said output electrical current capacity setting portion is configured to supply one of the first to k-th bias voltages to the control terminal of the bias transistor of each of the first to N-th output amplifiers.

6. A display driver for driving a display device according to a video signal, comprising:

a plurality of first to N-th output amplifiers (N is an integer greater than two) configured to amplify first to N-th gradation voltages each representing a brightness level per pixel according to the video signal so that the first to N-th output amplifiers obtain first to N-th pixel drive voltages; and an output electrical current capacity setting portion, wherein said first to N-th output amplifiers are configured to output the first to N-th pixel drive voltages to the display device, said output electrical current capacity setting portion is configured to set an output electrical current capacity of each of the first to N-th output amplifiers individually or in a group of a specific number of the first to N-th output amplifiers, said output electrical current capacity setting portion is configured to set an output electrical current capacity of each of the first to N-th output amplifiers individually or in a group of a specific number of the first to N-th output amplifiers, said output electrical current capacity setting portion is configured to generate first to N-th setting signals corresponding to the first to N-th output amplifiers, said output electrical current capacity setting portion is configured to supply the first to N-th setting signals to the first to N-th output amplifiers so that the output electrical current capacity setting portion sets the output electrical current capacity of each of the first to N-th output amplifiers, each of said first to N-th output amplifiers includes an operation amplifier for amplifying one of the first to N-th gradation voltages and an output electrical current adjusting transistor, said output electrical current adjusting transistor is configured to adjust an electrical current amount of an output electrical current output from the operation amplifier according to a voltage of a control terminal thereof, said output electrical current adjusting transistor is configured to supply the output electrical current thus adjusted to the display device through an external wiring so that one of the first to N-th pixel drive voltages is generated in the external wiring, said output electrical current capacity setting portion is configured to generate first to N-th bias voltages as the first to N-th setting signals, and said output electrical current capacity setting portion is configured to supply one of the first to N-th bias voltages to the control terminal of the output electrical current adjusting transistor of each of the first to N-th output amplifiers.

7. The display driver according to claim 4, wherein said output electrical current capacity setting portion includes a bias voltage supplying path and a bias voltage generating portion, said bias voltage supplying path is formed of first to N-th resistors connected in series, said bias voltage generating portion is configured to generate a first bias potential and a second bias potential lower than the first bias potential, said bias voltage generating portion is configured to apply the first bias potential to one end portion of the bias voltage supplying path, said bias voltage generating portion is configured to apply the second bias potential to the other end portion of the bias voltage supplying path, and said bias voltage generating portion is configured to generate a voltage at one end portion or the other end portion of each of the first to N-th resistors as the first to N-th bias voltages.

* * * * *